United States Patent [19]

Newbould et al.

[11] 4,104,586

[45] Aug. 1, 1978

[54] APPARATUS FOR INDICATING THE SEQUENCE OF ALTERNATING CURRENT SIGNALS

[75] Inventors: Adrian Orton Newbould; Edward Piper Walker, both of Stafford; Anthony Williams, Newport, all of England

[73] Assignee: The General Electric Company Limited, London, England

[21] Appl. No.: 744,087

[22] Filed: Nov. 22, 1976

[30] Foreign Application Priority Data

Dec. 1, 1975 [GB] United Kingdom ............... 49229/75

[51] Int. Cl.² ........................................... G01R 25/00
[52] U.S. Cl. .................................. 324/83 D; 328/134
[58] Field of Search .............. 324/83 A, 83 D, 140 R, 324/140 D, 83 R; 328/134

[56] References Cited

U.S. PATENT DOCUMENTS

| 3,296,581 | 1/1967 | Warner | 324/83 A |
|---|---|---|---|
| 4,025,848 | 5/1977 | Delagrange | 324/83 D |

*Primary Examiner*—M. Tokar
*Attorney, Agent, or Firm*—Kirschstein, Kirschstein, Ottinger & Cobrin

[57] ABSTRACT

An apparatus which indicates the sequence of a pair of alternating current input signals by determining the sense of a datum crossing in one input signal with respect to the polarity of the other input signal at the time of the datum crossing.

14 Claims, 7 Drawing Figures

APPARATUS FOR INDICATING THE SEQUENCE OF ALTERNATING CURRENT SIGNALS

This invention relates to apparatus for indicating the sequence of alternating current signals.

It is an object of the present invention to provide a novel form of such apparatus capable of responding faster to a change of sequence than known apparatus.

According to the present invention an apparatus for indicating the sequence of a pair of alternating current input signals comprises means for producing in respect of at least one datum crossing in at least one input signal an output indicative of the sense of that datum crossing with respect to the polarity of the other input signal at the time of that datum crossing.

By a datum crossing in a signal is meant the passing of the instantaneous value of that signal through a datum value.

Normally said means produces a said output in respect of each datum crossing in both input signals.

Preferably said means includes first means for producing an output having a first value when the two input signals are of the same polarity and a second value when the two input signals are of opposite polarity in which case the apparatus suitably further includes second means for producing an output which assumes or remains at a first value in response to each datum crossing in one input signal and assumes or remains at a second value in response to each datum crossing in the other input signal, and third means responsive to the output of said second and first means to produce an output having a first value when the outputs of the first and second means both have their first values or both have their second values, and having a second value when the output of one of said first and second means has its first value and the other its second value, the output of the third means thereby having one value when one input signal lags the other, and its other value when that one input signal leads the other.

With such an arrangement the apparatus suitably further includes output means responsive to the output of said third means so as to produce an output when a particular output of the third means has persisted for a predetermined time. In a preferred form of such an arrangement the apparatus includes fourth means for producing an output pulse in response to each datum crossing in the input signals, and the output means comprises a counter which counts in one direction or the other in response to each output pulse of said fourth means according to whether the output of said third means has its first or second value, the counter producing an output when it reaches a particular count.

It will be appreciated that an apparatus in accordance with the invention may form part of an apparatus for indicating the sequence of three or more alternating current input signals. One particular such apparatus for indicating the sequence of three or more alternating current input signals comprises a number of two input apparatuses according to the invention, each responsive to a different pair of the input signals, and a logic circuit responsive to the outputs of said apparatuses so as to produce an output having a first value when at least p of said apparatuses indicate that their inputs are in a particular sequence corresponding to a particular overall sequence of the input signals and a second value when not more than q of said apparatuses indicate that their inputs are in the particular sequence corresponding to said particular overall sequence where $1 < p \leq r$ and $0 \leq q < r$, $r$ is the number of said apparatuses, and $p > q$. The output of the logic circuit means may be applied to output means as described above in relation to two-input apparatus in accordance with the invention.

The invention will now be further explained and several embodiments of the invention described, by way of example, with reference to the accompanying drawings in which.

The invention resides in the appreciation by the inventors that the sequence of a plurality of alternating current signals can be determined from a knowledge of the senses of the zero crossings in the signals with respect to the polarities of the other input signals.

Figures 1A, 1B:
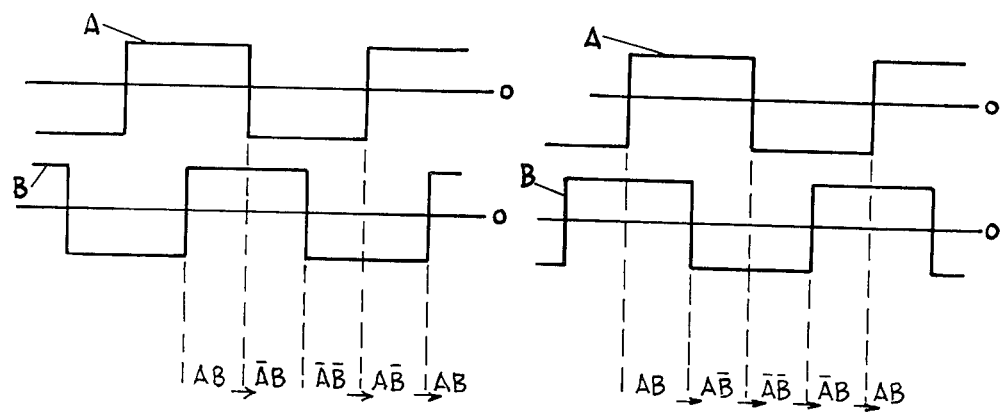
FIGS. 1a and 1b illustrate the two possible sequences of two square waves of the same frequency and unity mark/space ratio.

This is best understood by considering two unity mark/space ratio square wave signals A and B of the same frequency, as shown in FIG. 1, FIG. 1a showing signal A leading signal B and FIG. 1b showing signal B leading signal A, i.e. signal A lagging signal B.

By one signal leading (or lagging) another is meant that the phase of the one signal leads (or lags) the phase of the other by not more than 180°. Thus the case where signal A leads signal B by more than 180°, say $(180 + \theta)°$, is referred to as signal B leading signal A or signal A lagging signal B by $(180 - \theta)°$.

It can be seen from FIG. 1a that when signal A leads signal B the polarities of the signals change according to the sequence $$AB \ \overline{A}B \ \overline{A}\overline{B} \ A\overline{B} \ AB \quad (1)$$

where A and $\overline{A}$ represent positive and negative values of signal A respectively, and B and $\overline{B}$ represent positive and negative values of signal B respectively.

Similarly, from FIG. 1b it can be seen that when signal A lags signal B the polarities of the signals change according to the sequence $$AB \ A\overline{B} \ \overline{A}\overline{B} \ \overline{A}B \ AB \quad (2)$$

It can thus be seen from sequence (1) that when signal A leads signal B, the zero crossings in signal A are in a sense such that signal A changes to the opposite polarity to signal B, and the zero crossings in signal B are in a sense such that signal B changes to the same polarity as Signal A.

Similarly, it can be seen from sequence (2) that when signal A lags signal B the zero crossings in signal A are in a sense such that signal A changes to the same polarity as signal B, and the zero crossings in signal B are in a sense such that signal A changes to the opposite polarity to signal B.

Thus, an indication of the sequence of the input signals can be obtained from a knowledge of the sense of any one zero crossing in either input signal with respect to the polarity of the other input signal. In the majority of practical applications an indication based on a single cross-over is unsatisfactory and more satisfactory operation is obtained by looking at the sense of a number of successive cross-overs.

The required detection of the senses of the cross-overs is conveniently carried out by means of logic circuitry.

Figure 2:
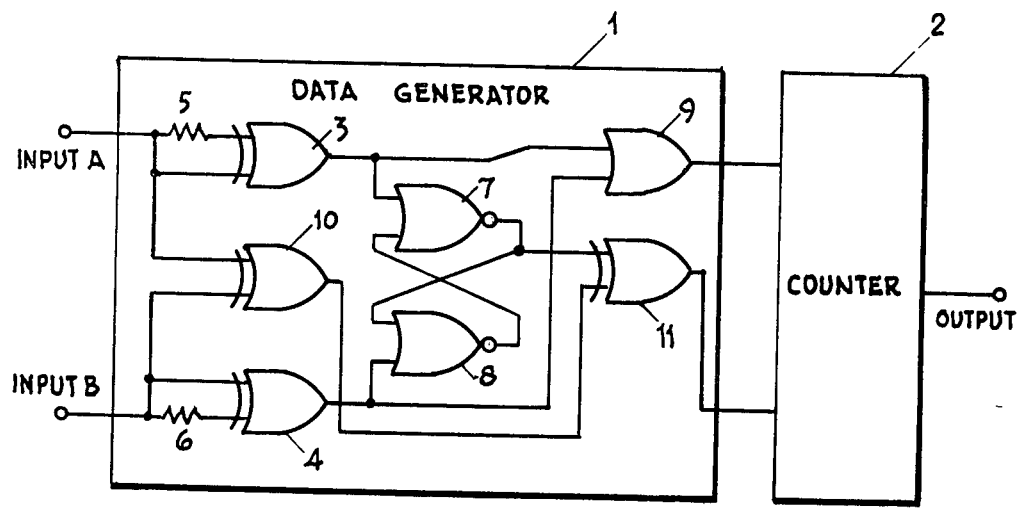
FIG. 2 is a block schematic diagram of a first embodiment of the invention.

One embodiment of an apparatus in accordance with the invention for indicating the sequence of two input signals A and B is shown in FIG. 2 in block schematic form.

Referring to FIG. 2, the apparatus comprises a logic circuit arrangement 1, referred to hereinafter as a data generator, for indicating the senses of the cross-overs in the inputs, and a counter 2, for producing an output when a particular sequence has persisted for a predetermined number of cross-overs.

The data generator 1 includes a pair of two-input exclusive-OR gates 3 and 4, input A being applied directly to one input of the gate 3 and via a resistor 5 to the other input of the gate 3. The other input B is similarly applied directly to one input of gate 4, and via a resistor 6 to its other input.

The output of gate 3 is connected to one input of a two-input NOR gate 7 which is connected in a cross-coupled latch arrangement with a further NOR gate 8, the other input of the latch being connected to the output of the gate 4.

The outputs of the gates 3 and 4 are further connected to the respective inputs of an OR gate 9 whose output is connected to a count input of the counter 2.

The inputs A and B are further respectively applied to the respective inputs of a two-input exclusive-OR gate 10 whose output is applied to one input of a further two-input exclusive-OR gate 11, the other input of the gate 11 being derived from the gate 7 of the latch arrangement, and the output of the gate 11 being applied to an operate/restrain input of the counter 2.

The inputs A and B are unity mark/space ratio square wave signals of the same frequency except while their sequence is changing. It will be appreciated that the arrangement may be used to indicate the sequence of signals of other than square waveform by applying the input signals to the data generator inputs via squaring circuits.

Figure 3:
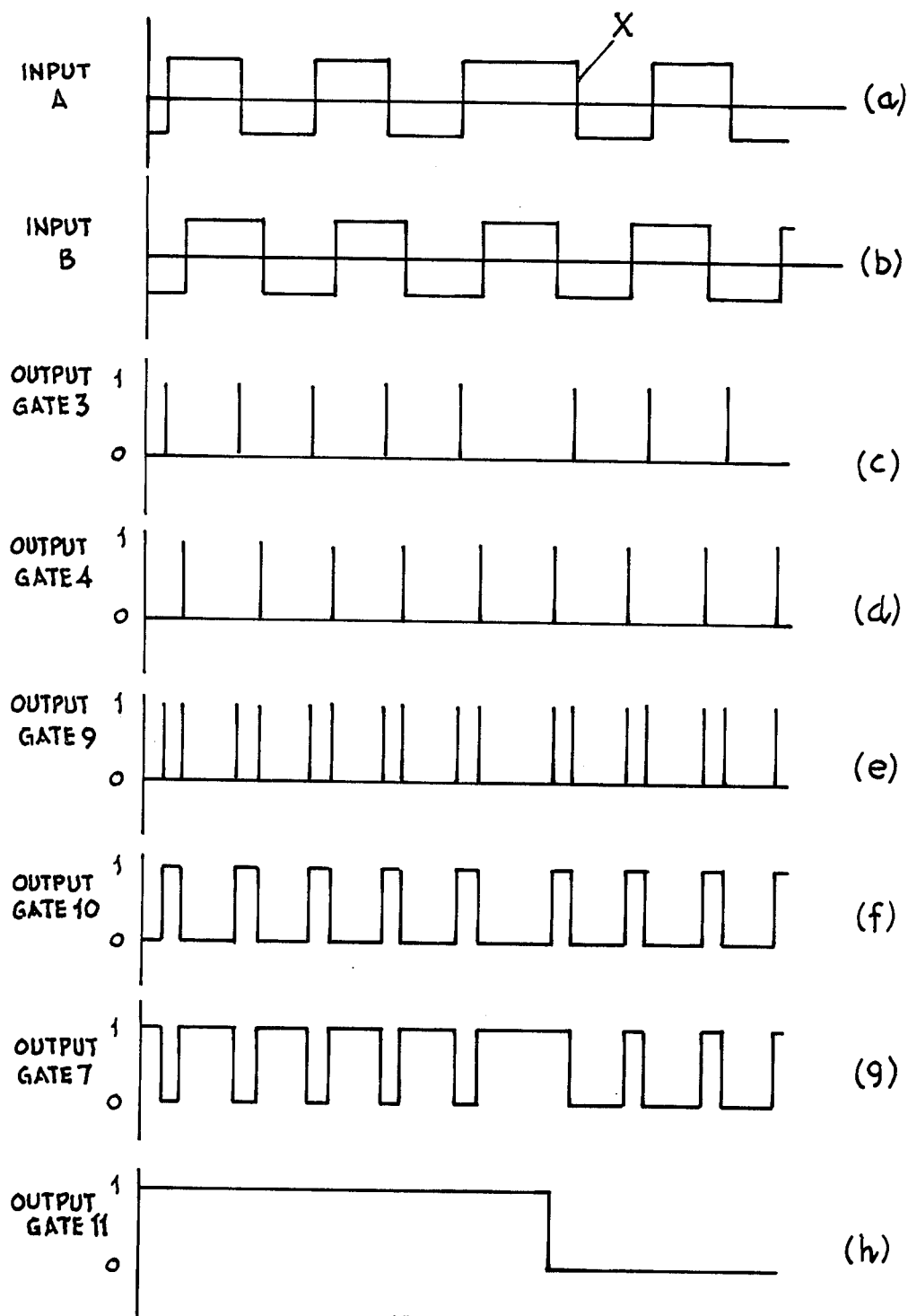
FIG. 3 shows waveforms appearing at various points in the embodiment of FIG. 2 in operation.

The operation of the apparatus will now be described with reference to FIG. 3, FIGS. 3a and 3b showing input A leading input B for two cycles and then rapidly changing to be lagging input B.

By virtue of the slight delay produced by the resistor 5 in conjunction with the gate 3 input capacitance, the gate 3 produces a logic '1' output momentarily in response to each cross-over in the signal A (see FIG. 3c). Similarly gate 4 produces a logic '1' output momentarily in response to each cross-over in the input signal B (see FIG. 2d). Thus a logic '1' appears momentarily at the output of gate 9 in response to each cross-over in the input signals (see FIG. 2e).

The output of gate 10 is '1' or '0' according to whether the inputs A and B are of different or the same polarity (see FIG. 3f), whilst the output of gate 7 becomes or remains '0' in response to each cross-over in input A and becomes or remains '1' in response to each cross-over in input B (see FIG. 3g). Hence, in response to a cross-over in input A of a sense such that signal A changes to the opposite polarity to signal B, the outputs of gates 7 and 10 become '0' and '1' respectively. Similarly, in response to a cross-over in input B of a sense such that signal B changes to the same polarity as signal A, the outputs of gates 7 and 10 become '1' and '0' respectively. Hence, whilst the cross-overs are in a sense corresponding to input A leading input B, the output of gate 11 remains at '1' (see FIG. 3h).

Similarly for cross-overs in input A of the other sense, as occur when input A lags input B, the outputs of gates 7 and 10 both become '0', whilst for cross-overs in input B of the other sense, as occur when input A lags input B, the outputs of gates 7 and 10 both become '1'. Thus the output of gate 11 remains at '0' when the cross-overs are in a sense corresponding to input A lagging input B (see FIG. 3h). Moreover the output of gate 11 changes when there is a change in the sequence of inputs A and B in response to the first cross-over in an input signal after the change in sequence (see cross-over X in FIG. 3a).

The counter 2 may be arranged to respond to the outputs of the data generator 1 in any one of a number of ways according to the particular input signal sequence it is desired to detect, and the integrity of detection required.

For example, to indicate that the sequence A leads B, the counter may be arranged to count up or down by the same amount, e.g. by one, for each '1' pulse at the output of gate 9, according to whether the output of gate 11 is '1' or '0' respectively, and to provide a '1' at its output when a particular count, typically in the range 2 to 20, is reached. The particular count at which the counter produces an output may be fixed or a variable dependent on some external factor. Alternatively, instead of counting up and down by the same amounts, the counter may be arranged to reset to zero or count down by $x$ in response to a '0' at the output of gate 11, $x$ being any chosen fixed number, or variable dependent on some external factor.

To indicate the sequence A lags B, the counter may be arranged to count up or down (or reset) according to whether the output of gate 11 is '0' or '1' respectively, or alternatively, an inverter may be provided at the output of gate 11.

In some applications, it may be desirable to limit the maximum rate of counting of the counter 2.

In still further arrangements the counter may be replaced by integrating means.

Figure 4:
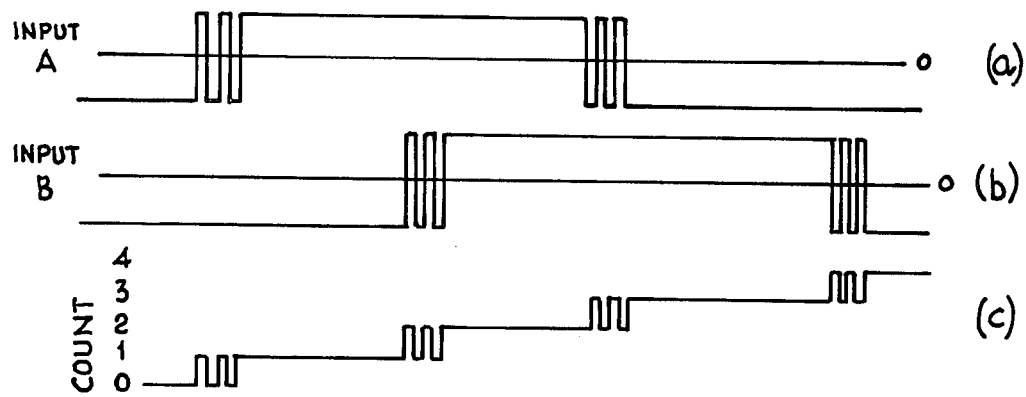
FIG. 4 illustrates the operation of the embodiment of FIG. 2 in the presence of high frequency interference signals.

The simple count up-or-down-by-one (or more) mode of operation has a particular advantage where the input signals are subject to high frequency interference. FIGS. 4a and 4b show typical waveforms for inputs A and B that may occur in the presence of such interference. It will be appreciated that the interference adds extra pairs of cross-overs, one cross-over of each pair increasing the count by one while the other cross-over of that pair reduces the count by one (see FIG. 4c). Thus the total effect of the interference on the count of the counter is zero, and the apparatus has inherent high frequency rejection, a feature not present in known sequence comparators.

It will be appreciated that while the embodiment of FIG. 2 indicates the sequence of two inputs, the invention is equally applicable to apparatus for indicating the sequence of three or more inputs. Such an apparatus may incorporate a data generator logic circuit corresponding to the generator 1 of FIG. 2 but arranged to supply the operate/restrain counter input with a single logical output '1' or '0' according to whether the inputs are in a particular sequence or not. However, since the number of possible sequences rises rapidly with number of inputs, (i.e. for $n$ inputs, giving $r = n_{c_2}$ different pairs of inputs, the number of possible sequences is $2^r$) it is generally simpler to consider a multi-input sequence as a particular combination of the possible sequences of the $n_{c_2}$ different pairs of the inputs.

Figure 5:
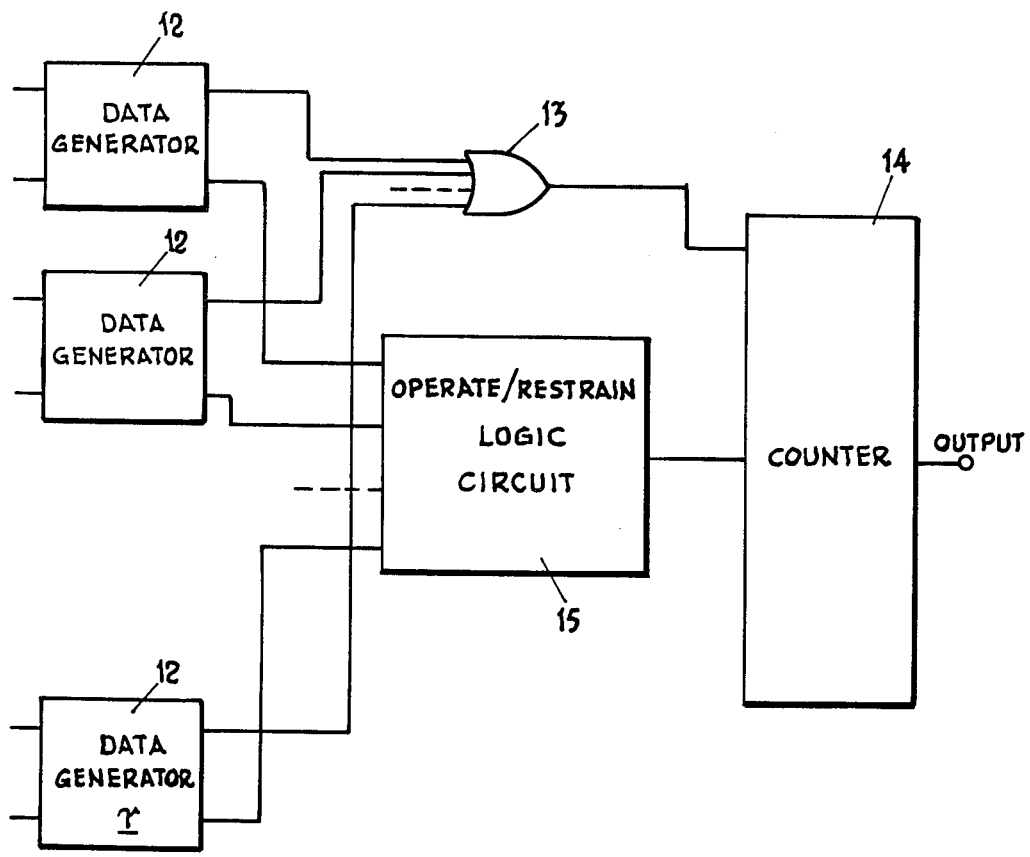
FIG. 5 is a block schematic diagram of a second embodiment of the invention.

The arrangement of such a multi-input apparatus is shown in FIG. 5. Thus the apparatus includes $r$ data generators 12 of the same form as shown in FIG. 2, each generator having as inputs a different pair of the $n$ inputs of the apparatus as a whole. The cross-over pulse outputs of the generators 12, i.e. their outputs corresponding to the gate 9 output of the arrangement of FIG. 2, are applied to respective inputs of an $r$ input OR gate 13 whose output is applied to the count input of a counter 14. The other outputs of the generators 12, i.e. their cross-over sense indicating outputs, are applied to respective inputs of an operate/restrain logic circuit 15 whose output is in turn applied to an operate/restrain input of the counter 14.

The circuit 15 is arranged to cause the counter 14 to count up when at least $p$ of the pairs of inputs are in a particular sequence corresponding to a particular overall sequence to be detected, where $1 < p \leq r$, and to count down by the same amount when not more than $q$ of the pairs of inputs are in the particular sequence corresponding to the particular overall sequence to be detected, where $0 \leq q < r$. Both $p$ and $q$ may be fixed, or be variable by some external factor, but, of course, $p$ must be greater than $q$.

Instead of causing the counter to count up and down by the same amount, the operate/restrain logic circuit 15 may control the operation of the counter 15 in any of the alternative ways described above with reference to FIG. 2.

Sequence indicating apparatus in accordance with the invention finds application wherever known forms of sequence indicating apparatus are used. However, one particular application which is envisaged for apparatus in accordance with the invention is in the construction of impedance characteristics in electric power transmission system protection devices, such as distance relays. The impedance characteristics of such devices are described in detail in chapter 3 of Volume 1 of a book entitled Protective Relays, their Theory and Practice by A. R. van C. Warrington, published by Chapman and Hall, 1962. However for the purposes of the present specification it is merely necessary to appreciate that a sequence indicating apparatus when so used in such a device is basically required to indicate whether a first signal leads or lags a second signal, the signals being chosen according to the required impedance characteristic of the protection device. It will be appreciated from the foregoing description that an apparatus in accordance with the invention is well suited to such an application, especially because of its fast operate time, and because of the ease in which its operate condition can be varied.

Figure 6:
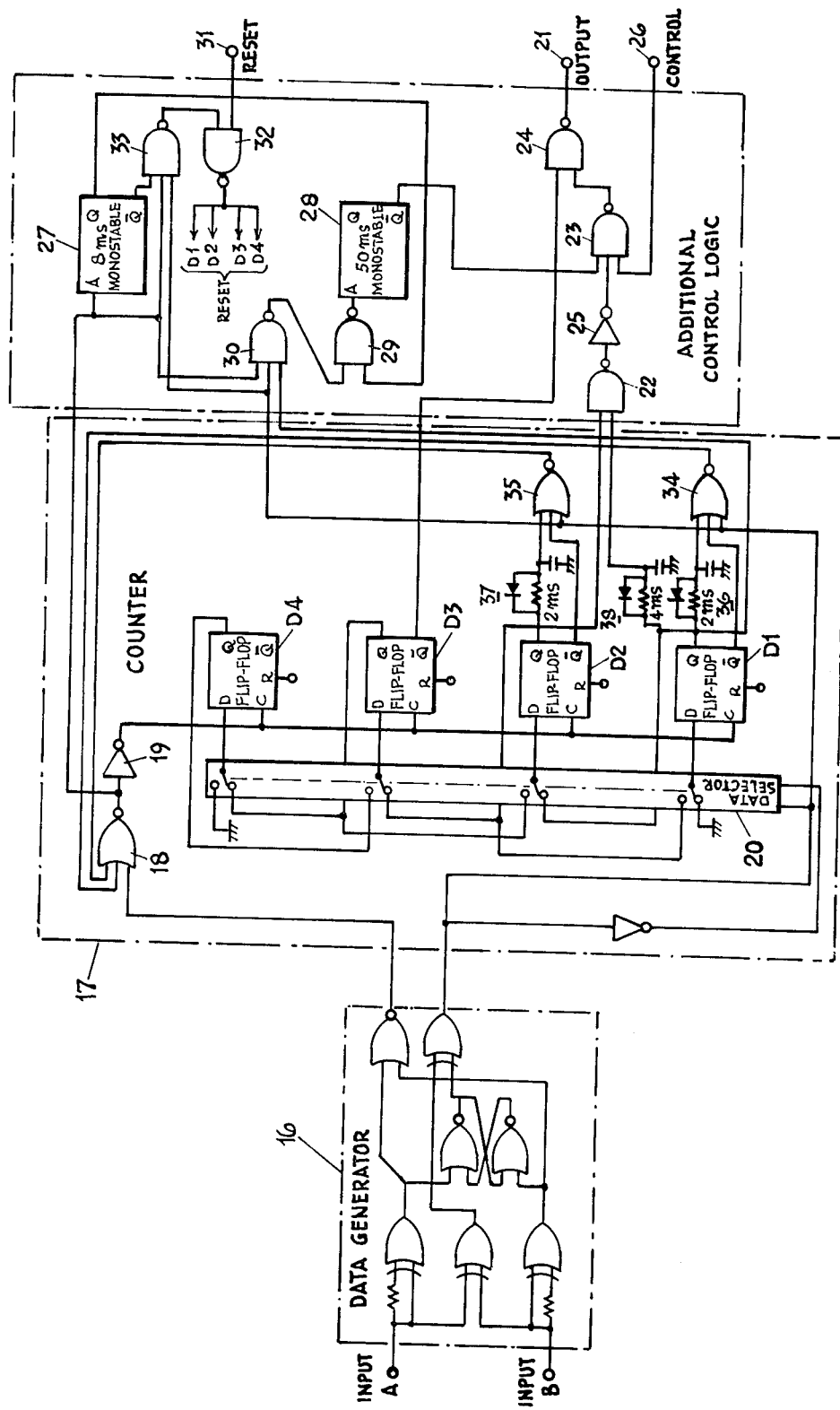
FIG. 6 is a block schematic diagram of a third embodiment of the invention designed for use in power system protection applications.

FIG. 6 is a block schematic diagram of a two-input sequence indicating apparatus in accordance with the present invention suitable for use in power system protection applications.

The apparatus includes a data generator 16 of the same form as the data generator of FIG. 2 except that its cross-over pulse output is inverted.

The apparatus further includes a counter 17 comprising four flip-flop stages D1 to D4 to each of which the cross-over pulse output of the generator 16 is applied via a NOR gate 18 and an inverter 19. The count direction of the counter 17 is controlled by a data selector 10 in dependence on the cross-over sense indicating output of the generator 16. When input A lags input B, the stages D1 to D4 are operated in turn by successive cross-over pulses from a first condition to a second condition, starting with stage D1. Similarly, when input A leads input B the stages D1 to D4 are operated in turn into their second condition, starting with stage D4.

The apparatus is arranged to provide a logic '1' output at an output terminal 21 either when the counter stages D1 and D2 are both in their second condition, or when the counter stages D1, D2 and D3 are all in their second condition. The required output condition is selected by logic circuitry constituted by NAND gates 22 to 24 and inverter 25, this circuitry being put into the two-stage output condition by application of a logic '1' to a terminal 26, and into the three-stage output condition by application of a logic '0' to the terminal 26.

An 8 millisecond monostable 27 and a 50 millisecond monostable 28 together with an associated NAND gate 29 serve to operate the apparatus into its three-stage output condition automatically for 50 milliseconds when the period between cross-over pulses produced by the data generator 16 exceeds 8 milliseconds. A further NAND gate 30 whose output controls the NAND gate 29 similarly causes the apparatus to assume its three-stage output condition for 50 milliseconds when the data generator cross-over sense indicating output indicates that input A leads input B, the stage D1 of the counter is in its second condition, and the data generator is producing a cross-over pulse. The provision of these functions is found to improve significantly the performance of the associated protective apparatus.

Reset of the counter is obtained by applying a logic '0' to a terminal 31 connected to one input of a two-input NAND gate 32 whose output is connected to reset inputs of the flip-flops D1 to D4. The other input of the gate 32 is connected to the output of a NAND gate 33 having inputs such that the counter is automatically reset when more than 8 milliseconds has elapsed between cross-over pulses produced by the data generator 16, the cross-over sense indicating output of the generator 16 indicates that input A leads input B, and the data generator 16 is producing a cross-over pulse.

To assist in preventing maloperation of the apparatus by random interference on the input signals, stages D1 and D2 of the counter are prevented from counting up in response to pulses less than 2 milliseconds apart. This is achieved by NOR gates 34 and 35 whose outputs are connected to respective inputs of NOR gate 18. Each of the gates 34 and 35 has a first input connected to the cross-over sense indicating output of the generator 16, a second input connected via a 2 millisecond delay circuit 36 or 37 to the normal output of the associated counter stage D1 or D2, and a third input connected directly to the inverted output of the associated counter stage D1 or D2. In consequence, after stage D1 or D2 changes into its second condition, i.e. during counting up, the NOR gate 18 inhibits the application of further input pulses to the flip-flops D1 to D4 for 2 milliseconds.

A 4 millisecond delay circuit 38 is connected between the output of stage D1 and the gate 22 to provide a similar delay in the appearance of an output at terminal 21 after operation of stages D1 and D2 into their second condition.

It will be appreciated from the above description with reference to FIG. 6 that a sequence indicating apparatus in accordance with the invention lends itself to the provision of means for controlling its operate condition.

We claim:

1. An apparatus for indicating the sequence of a pair of alternating current input signals comprising:

first means which produces an output having a first value when the two input signals are of the same polarity and a second value when the two input signals are of opposite polarity, to thereby indicate in respect of each datum crossing in both input signals the sense of that datum crossing with respect to the polarity of the other input signal at the time of that datum crossing;

second means which produces an output which assumes or remains at a first value in response to each datum crossing in one input signal and assumes or remains at a second value in response to each datum crossing in the other input signal; and third means responsive to the output of said second and first menas which produces an output having a first value when the outputs of the first and second means both have their first values or both have their second values, and having a second value when the output of one of said first and second means has its first value and the other its second value, the output of the third means thereby having one value when one input signal lags the other, and its other value when that one input signal leads the other.

2. An apparatus according to claim 1 wherein said first means comprises an exclusive-OR gate.

3. An apparatus according to claim 1 including output means responsive to the output of said third means so as to produce an output when a particular output of the third means has persisted for a predetermined time.

4. An apparatus according to claim 3 including fourth means which produces an output pulse in response to each datum crossing in the input signals and wherein said output means comprises a counter which counts in one direction or the other in response to each output pulse of said fourth means according to whether the output of said third means has its first or second value, the counter producing an output when it reaches a particular count.

5. An apparatus according to claim 4 wherein the counter counts by the same amount in response to each output pulse of the fourth means.

6. An apparatus according to claim 4 wherein said particular count is externally controllable.

7. An apparatus according to claim 4 wherein the amount by which the counter counts in response to an output pulse of the fourth means is externally controllable.

8. An apparatus according to claim 4 wherein said counter is reset to zero in response to an output pulse of the fourth means when the output of said third means has one of its values.

9. An apparatus according to claim 4 wherein the maximum rate of counting of said counter is limited.

10. An apparatus for indicating the sequence of three or more alternating current input signals comprising a number of apparatuses according to claim 1, each responsive to a different pair of the input signals, and a logic circuit responsive to the outputs of said apparatuses so as to produce an output having a first value when at least $p$ of said apparatuses indicate that their inputs are in a particular sequence corresponding to a particular overall sequence of the input signals and a second value when not more than $q$ of said apparatuses indicate that their inputs are in the particular sequence corresponding to said particular overall sequence where $1 < p \leq r$ and $0 \leq q < r$, $r$, is the number of said apparatuses, and $p > q$.

11. An apparatus according to claim 10 wherein at least one of $p$ and $q$ is externally controllable.

12. An apparatus according to claim 10 including input means responsive to the output of said logic circuit so as to produce an output when a particular output of said logic circuit has persisted for a predetermined time.

13. An apparatus according to claim 12 including fourth means which produces an output pulse in response to each datum crossing in the input signals and wherein said output means comprises a counter which counts in one direction or the other in response to each output pulse of said fourth means according to whether the output of the logic circuit has its first or second value, the counter producing an output when it reaches a particular count.

14. An electric power transmission system protection device incorporating an apparatus for indicating the sequence of alternating current signals according to claim 1.

* * * * *